US010498315B2

(12) United States Patent
Jodka et al.

(10) Patent No.: US 10,498,315 B2
(45) Date of Patent: Dec. 3, 2019

(54) LEVEL SHIFTER CIRCUIT

(71) Applicant: TEXAS INSTRUMENTS INCORPORATED, Dallas, TX (US)

(72) Inventors: Eduardas Jodka, Freising (DE); Julian Becker, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/911,719

(22) Filed: Mar. 5, 2018

(65) Prior Publication Data

US 2019/0273485 A1   Sep. 5, 2019

(51) Int. Cl.
*H03K 3/00*       (2006.01)
*H03K 3/356*      (2006.01)
*H03K 19/0185*    (2006.01)

(52) U.S. Cl.
CPC ........ *H03K 3/356113* (2013.01); *H03K 19/018507* (2013.01)

(58) Field of Classification Search
CPC ... H03K 19/018521; H03K 19/018528; H03K 3/356113; H03K 19/00315; H03K 19/00361; H04L 25/028; H04L 25/0272; G11C 8/08; G11C 5/145; G11C 7/12
See application file for complete search history.

(56) References Cited

U.S. PATENT DOCUMENTS

| 7,129,752 | B2 | 10/2006 | Bayer | |
| 2012/0075001 | A1* | 3/2012 | Sumitomo | ....... H03K 3/356165 327/333 |
| 2013/0285628 | A1 | 10/2013 | Giannopoulos et al. | |
| 2014/0333365 | A1* | 11/2014 | Takahashi | ........ H03K 3/356017 327/333 |

FOREIGN PATENT DOCUMENTS

EP   1835507 A1   9/2007

OTHER PUBLICATIONS

Moghe, Yashodhan, Torsten Lehmann, and Tim Piessens. "Nanosecond Delay Floating High Voltage Level Shifters in a 0.35μm HV-CMOS Technology." IEEE Journal of Solid-State Circuits 46.2 (2011): 485-497.
Search Report for PCT Application No. PCT/US19/20658, Date of mailing of international search report Aug. 8, 2019, 1 page.

* cited by examiner

*Primary Examiner* — Long Nguyen
(74) *Attorney, Agent, or Firm* — Tuenlap Chan; Charles A. Brill; Frank D. Cimino

(57) ABSTRACT

A level shifter with reduced propagation delay. A level shifter includes a signal input terminal, a first signal output node, a first transistor, a second transistor, a third transistor, and a first capacitor. The first transistor includes a control terminal coupled to the signal input terminal. The second transistor includes an output terminal coupled to an input terminal of the first transistor. The first capacitor includes a bottom plate coupled to an input terminal of the second transistor. The third transistor includes a control terminal coupled to a top plate of the first capacitor, and an output terminal coupled to the first signal output node.

16 Claims, 4 Drawing Sheets

LEVEL SHIFTER CIRCUIT

BACKGROUND

Electronic systems often have circuits that are powered by different power supply voltages, or that require different signal levels to activate circuit components. In such systems level shifting circuits (level shifters) are used to translate signals from one voltage level to another. For example, a level shifter may be used to translate a signal from a lower voltage to a higher voltage, or to translate a signal from a higher voltage to a lower voltage. In switch-mode power supplies, level shifters are used to convert/translate control signals to a voltage that enables a desired driving capability of the power supply's power transistors

SUMMARY

A level shifter with reduced propagation delay is disclosed herein. In one example, a level shifter includes a signal input terminal, a first signal output node, a first transistor, a second transistor, a third transistor, and a first capacitor. The first transistor includes a control terminal coupled to the signal input terminal. The second transistor includes an output terminal coupled to an input terminal of the first transistor. The first capacitor includes a bottom plate coupled to an input terminal of the second transistor. The third transistor includes a control terminal coupled to a top plate of the first capacitor, and an output terminal coupled to the first signal output node.

In another example, a level shifter includes an input circuit, an output circuit, and an interface circuit. The input circuit is coupled to a low voltage rail and is configured to receive an input signal. The output circuit is coupled to a high voltage rail and is configured to generate an output signal at a voltage of the high voltage rail. The interface circuit is configured to transfer signal from the input circuit to the output circuit. The output circuit includes a first output node, and a first boost circuit. The first boost circuit includes a first transistor that is capacitively coupled to the interface circuit. The first transistor is configured to drive the voltage of the high voltage rail onto the first output node responsive to a first signal received from the interface circuit.

In a further example, a switch-mode power supply includes a power transistor, a gate driver, and a level shifter. The power transistor configured to drive an inductor. The gate driver is coupled to the power transistor, and is configured to drive a control terminal of the power transistor. The level shifter is coupled to the gate driver. The level shifter includes a low voltage rail, a high voltage rail, an input circuit, an interface circuit, an output circuit. The input circuit is powered via the low voltage rail. The interface circuit is coupled to the input circuit. The output circuit is coupled to the high voltage rail and to the interface circuit. The output circuit includes a first boost circuit and a second boost circuit. The first boost circuit includes a first transistor that is capacitively coupled to the interface circuit. The first transistor is configured to switchably connect the high voltage rail to a first output node responsive to a first signal received from the interface circuit. The second boost circuit includes a second transistor that is capacitively coupled to the interface circuit. The second transistor configured to switchably connect the high voltage rail to a second output node responsive to a second signal received from the interface circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Level shifters enable communication between circuits operating at different power supply voltages. Reduction of propagation delay through a level shifter is desirable to enable high-speed properties of the circuits. Level shifter implementations include various circuits to reduce propagation delay. Some level shifter implementations include feed forward circuitry that reduces delay by capacitively coupling input circuitry to output circuitry of the level shifter. Feed forward capacitors provide direct dynamic control of the output from the input. However, reduction of propagation delay decreases with the input circuitry power supply voltage, and implementations require high voltage capacitors that are not available in all semiconductor processes or increase manufacturing cost. Furthermore, clamping circuitry is required to reduce the potential for overvoltage damage in the input circuitry.

Other level shifter implementations add a set/reset latch to the output circuitry. Such implementations rely on the discharge path through the low voltage circuitry to quickly toggle the logic state of the output of the high voltage circuitry. Resolving metastability in the latch requires the addition of synchronization circuitry operating in the level shifter's high voltage domain, which can be problematic.

The level shifters disclosed herein include boost circuitry in the high voltage circuitry to reduce propagation delay on low to high output signal transitions. The boost circuitry uses the path through the transistors of the low voltage circuitry to trigger fast charging of the output of the high voltage circuitry. No high voltage capacitors and associated clamping circuitry, or latch synchronization circuitry is needed. Because the boost circuitry quickly pulls up the high voltage outputs, the size of various other components (e.g., high voltage pull-up and clamping devices) of the level shifter may be reduced.

Figure 1:
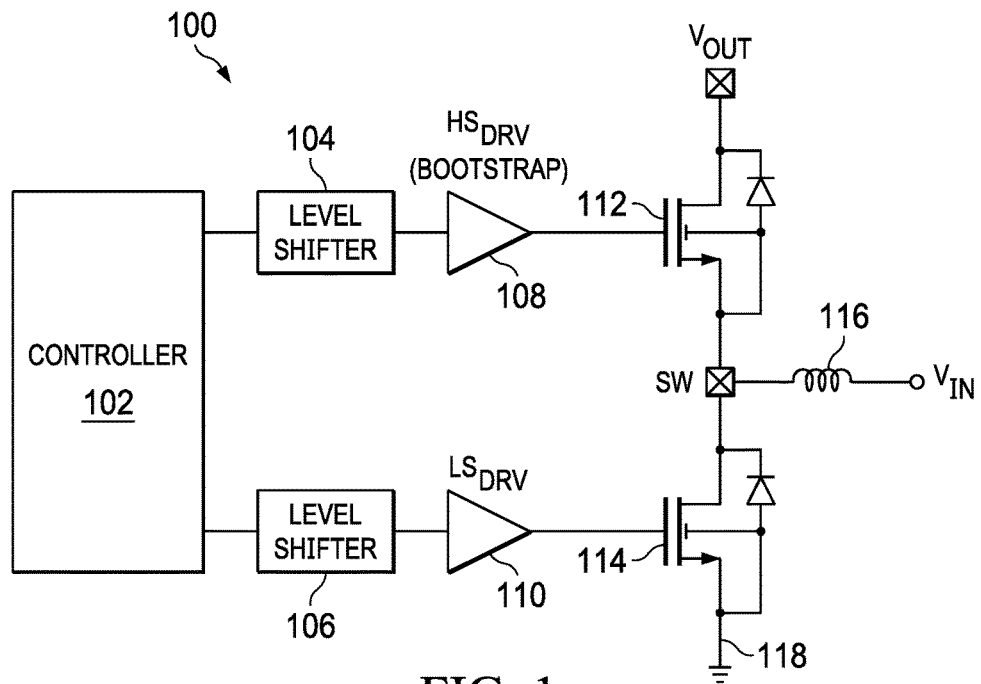
FIG. 1 shows a block diagram of an example of a switch-mode power supply that includes a level shifter in accordance with the present disclosure.

FIG. 1 shows a block diagram of an example of a switch-mode power supply 100 that includes a level shifter in accordance with the present disclosure. The switch-mode power supply 100 includes a controller 102, a high-side level shifter 104, a low-side level shifter 106, a high-side driver 108, a low-side driver 110, a high-side power transistor 112, a low-side power transistor 114, and an inductor 116. The switch-mode power supply 100 may include additional components that have been omitted from FIG. 1 in the interest of clarity.

The controller 102 generates output pulses that control the switching of the low-side power transistor 114 and the high-side power transistor 112. For example, the controller 102 may compare voltage at the load side of the inductor 116 to a reference voltage to generate an error signal, and apply the error signal to control a pulse width modulator. The output of the pulse width modulator is the pulses that control the switching of the low-side power transistor 114 and the high-side power transistor 112.

The high-side power transistor 112 and the low-side power transistor 114 respectively connect the inductor 116 to power supply rails under the control of the output signals generated by the controller 102. The high-side power transistor 112 and low-side power transistor 114 may be n-channel metal oxide semiconductor transistors (MOSFETs). The low-side power transistor 114 is coupled to the low-side driver 110. The low-side driver 110 provides the current needed to quickly charge the gate capacitance of the low-side power transistor 114. The low-side driver 110 is coupled to the low-side level shifter 106. The low-side level shifter 106 shifts the signal received from the controller 102 to a higher voltage to efficiently drive the low-side power transistor 114. Because the low-side power transistor 114 is coupled to the ground 118, the high voltage circuitry of the low-side level shifter 106 may also be referenced to ground.

The high-side driver 108 is coupled to the high-side power transistor 112. The high-side driver 108 provides the current needed to quickly charge the gate capacitance of the high-side power transistor 112. The high-side driver 108 is coupled to the high-side level shifter 104. The high-side level shifter 104 shifts the signal received from the controller 102 to a higher voltage to efficiently drive the high-side power transistor 112. Because the high-side power transistor 112 is not referenced to the ground 118, the high-voltage circuitry of the high-side level shifter 104 may also not be referenced to the ground 118, while the low-voltage circuitry of the high-side level shifter 104 may be referenced to the ground 118. The high-side level shifter 104 includes boost circuitry that reduces the rise time of output signal of the high-side level shifter 104.

Figure 2:
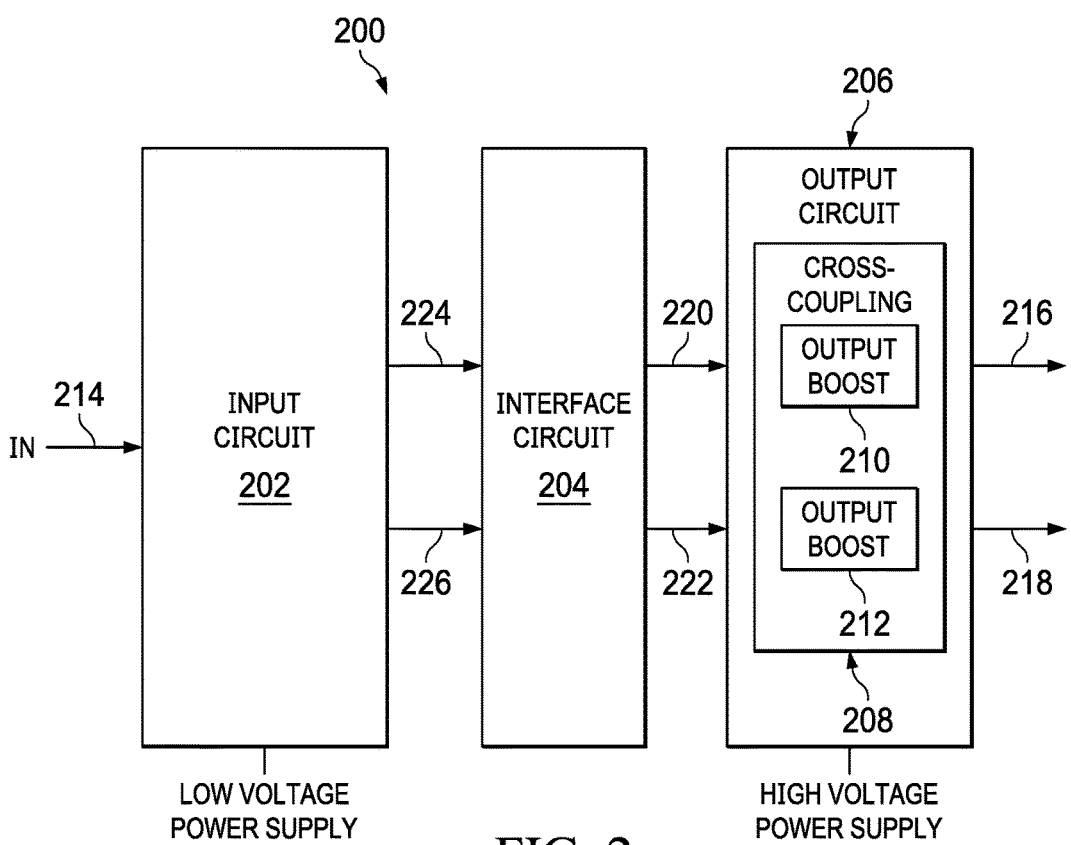
FIG. 2 shows a block diagram of an example of a level shifter in accordance with the present disclosure.

FIG. 2 shows a block diagram of an example of a level shifter 200 in accordance with the present disclosure. The level shifter 200 may be an implementation of the high-side level shifter 104. The level shifter 200 includes an input circuit 202, an interface circuit 204, and an output circuit 206. The input circuit 202 is coupled to a low voltage power supply. For example, the input circuit 202 may be powered by a 1.8 volt power supply. The input circuit 202 receives the input signal 214 and provides the received signal to the output circuit 206 via the interface circuit 204. The input circuit 202 may provide an inverted version (e.g., signal 224) and a non-inverted version (signal 226) of received signal 214 to the interface circuit 204.

The interface circuit 204 includes clamp circuitry that passes the output signals (224 and 226) of the input circuit 202 to the output circuit 206 and limits the voltage of the signal received by the output circuit 206 to be no lower than the reference voltage (e.g., the ground) of the high voltage power supply powering the output circuit 206. The voltage of the high voltage power supply may be, for example, 10 volts, and the ground reference provided by the high voltage power supply may be at a higher voltage than the ground reference provided by the low voltage power supply coupled to the input circuit 202.

The output circuit 206 includes cross coupling circuitry 208 that receives the signal 220 and the signal 222 provided by the interface circuit 204 and drives the output of the output circuit 206 to the voltages provided by the high-voltage power supply responsive to the received signals. The cross coupling circuitry 208 includes boost circuit 210 and boost circuit 212. The boost circuit 210 and the boost circuit 212 are capacitively coupled to the outputs of the interface circuit 204. Due to cross-coupling, the falling edge of the signal 220 results in the output 218 being quickly pulled up by the boost circuit 210, and the falling edge of the signal 222 results in the output 216 being quickly pulled up by the boost circuit 210. Thus, the boost circuits 210 and 212 increase the output edge rate, and reduce the propagation delay, of the level shifter 200.

Figure 3:
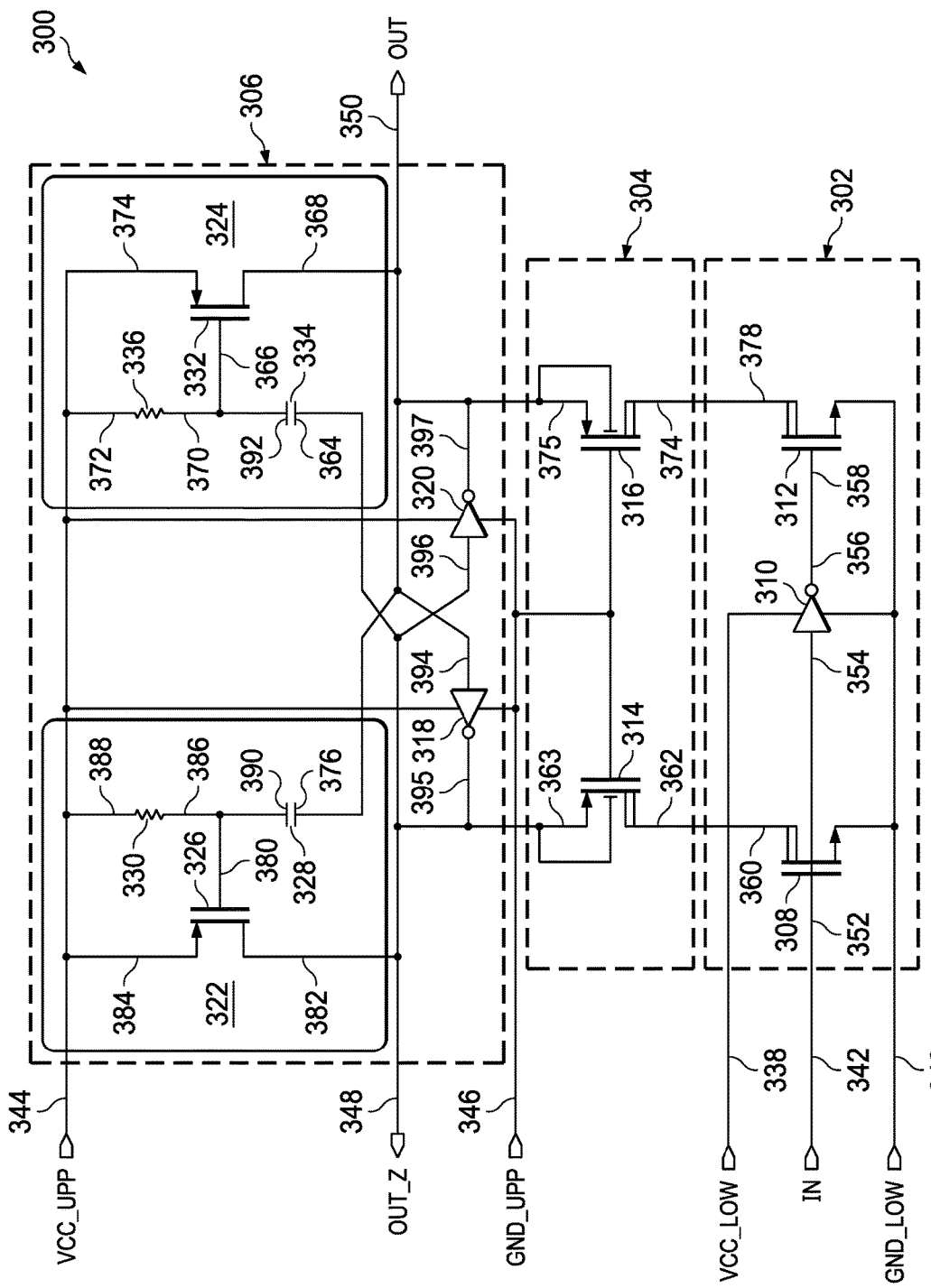
FIG. 3 shows a schematic of an example of a level shifter in accordance with the present disclosure.
Figure 4:
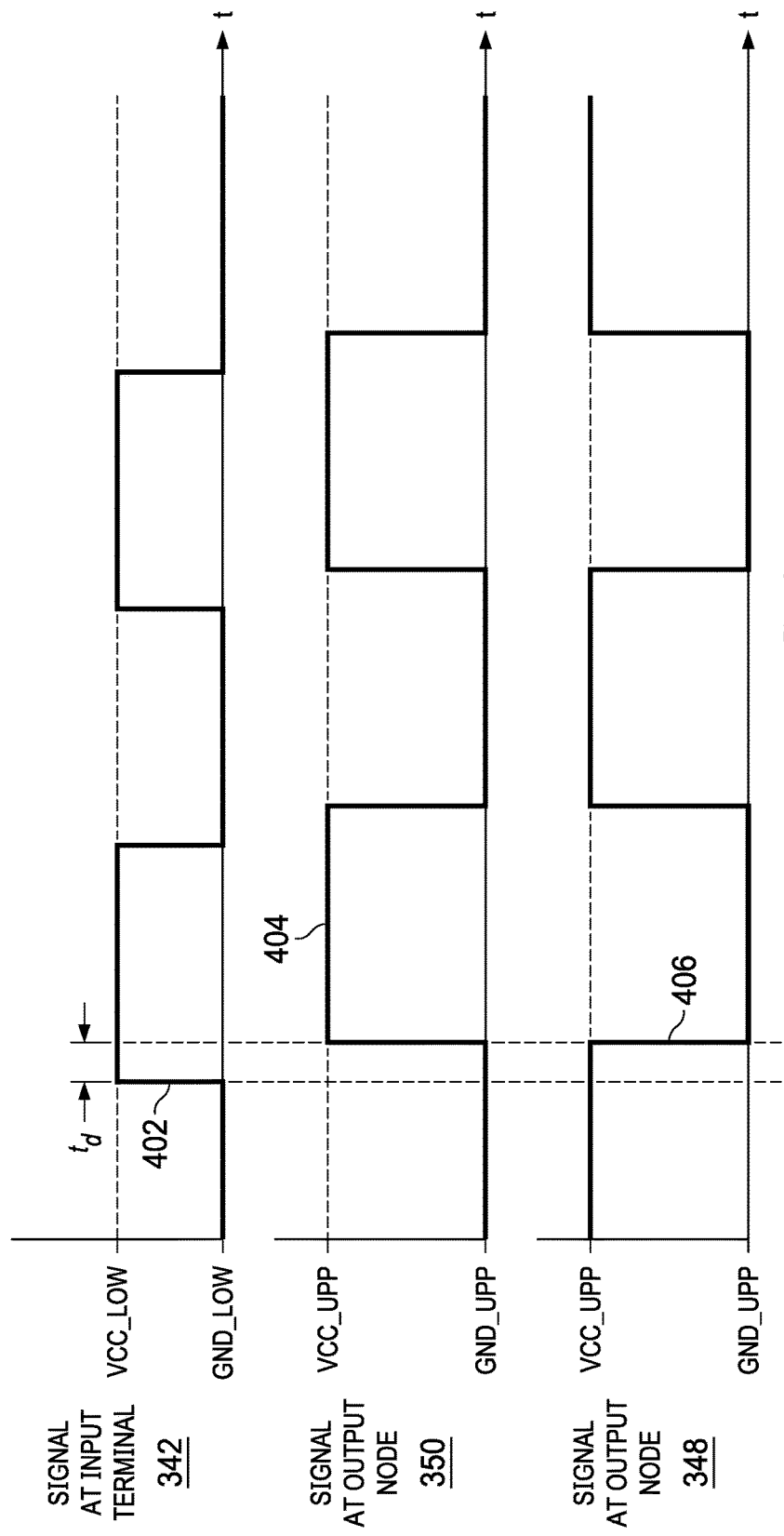
FIGS. 4 and 5 shows timing diagrams of signals in a level shifter in accordance with the present disclosure.

FIG. 3 shows a schematic of an example of a level shifter 300 in accordance with the present disclosure. The level shifter 300 is one of several implementations of the high-side level shifter 104 and the level shifter 200. The level shifter 300 generates one or more output signals at a higher voltage than the voltage of the input signal. FIG. 4 shows an example of signals received and output by the level shifter 300. The level shifter 300 includes an input terminal 342 for receiving an input signal generated using a "lower" supply voltage, and includes output nodes 348 and 350 for generating, at a higher voltage, an output signal corresponding to the received input signal. FIG. 4 shows input signal 402 generated between power supply rails VCC_LOW and GND_LOW. Signal 406 at output node 348 is an inverted version of the signal 402, with propagation delay td, generated between power supply rails VCC_UP and GND_UP. Signal 404 at output node 350 is a non-inverted version of the signal 402, with propagation delay td, generated between power supply rails VCC_UP and GND_UP. In practice, the propagation delays between edges of the input signal 402 and edges of the signals 404 and 406 may differ based on whether the edges of the signals 404 and 406 are rising or falling.

The level shifter 300 includes an input circuit 302, interface circuit 304, and output circuit 306, a signal input terminal 342, an inverted output node 348, a non-inverted output node 350. The input circuit 302 is coupled to low voltage rails 338 and 340. The output circuit 306 is coupled to high voltage rails 344 and 346. The high voltage rail 344 may also be referred to as a high voltage power supply terminal. The input circuit 302 is one of several implementations of the input circuit 202, the interface circuit 304 is one of several implementations of the interface circuit 204, and the output circuit 306 is one of several implementations of the output circuit 206.

The input circuit 302 includes transistor 308, inverter 310, and transistor 312. The transistor 308 and the transistor 312 may be n-channel MOSFETs (possibly having a drain extension). The transistor 308 includes a control terminal 352 (e.g., a gate terminal) that is coupled to the signal input terminal 342 of the level shifter 300. The inverter 310 includes an input terminal 354 that is coupled to the signal input terminal 342 of the level shifter 300, and an output terminal 356 that is coupled to the control terminal 358 (e.g., a gate terminal) of the transistor 312.

The interface circuit 304 includes a transistor 314 and a transistor 316. The transistor 314 and the transistor 316 may be p-channel MOSFETs (possibly having a drain extension). An input terminal 360 (e.g., drain terminal) of the transistor 308 is coupled to an output terminal 362 (e.g., drain terminal) of the transistor 314. An input terminal 378 (e.g., drain terminal) of the transistor 312 is coupled to an output terminal 374 (e.g., drain terminal) of the transistor 316. An input terminal 363 (e.g., source terminal) of the transistor 314 is coupled to the inverted output node 348. An input terminal 375 (e.g., source terminal) of the transistor 316 is coupled to the non-inverted output node 350. Activation of the transistor 308 produces current flow in the transistor 314 that pulls the inverted output node 348 to the high voltage ground 346. Activation of the transistor 312 produces current flow in the transistor 316 that pulls the non-inverted output node 350 to the high voltage ground 346.

The output circuit 306 includes cross coupling circuitry that drives the inverted output node 348 based on the state of the non-inverted output node 350 and drives the non-inverted output node 350 based on the state of the inverted output node 348. The cross coupling circuitry of the output circuit 306 includes an inverter 318, an inverter 320, a boost circuit 322, and a boost circuit 324. The inverter 318 includes an output terminal 395 that is coupled to the inverted output node 348, and an input terminal 394 that is coupled to the non-inverted output node 350. The inverter 320 includes an output terminal 397 that is coupled to the non-inverted output node 350, and an input terminal 396 that is coupled to the inverted output node 348.

The boost circuit 322 includes a transistor 326, a capacitor 328, and a resistor 330. The transistor 326 may be a p-channel MOSFET. The capacitor 328 capacitively couples the transistor 326 to the non-inverted output node 350, so that when the non-inverted output node 350 is pulled down via the transistor 316 by the transistor 312, the transistor 326 is momentarily activated to pull up the inverted output node 348, thereby increasing the low-to-high transition rate (the rising edge rate) of the inverted output node 348. The capacitor 328 includes a bottom plate 376 that is coupled to the non-inverted output node 350 and a top plate 390 that is coupled to a control terminal 380 (e.g., gate terminal) of the transistor 326. An input terminal 384 (e.g., source terminal) of the transistor 326 is coupled to the high voltage rail 344. An output terminal 382 (e.g., drain terminal) of the transistor 326 is coupled to the inverted output node 348. The resistor 330 includes a terminal 386 coupled to the control terminal 380 of the transistor 326, and a terminal 388 coupled to the high voltage rail 344. The resistor 330 provides a reset for the boost circuit 322.

The boost circuit 324 includes a transistor 332, a capacitor 334, and a resistor 336. The transistor 332 may be a p-channel MOSFET. The capacitor 334 capacitively couples the transistor 332 to the inverted output node 348, so that when the inverted output node 348 is pulled down via the transistor 314 by the transistor 308, the transistor 332 is momentarily activated to pull up the non-inverted output node 350, thereby increasing the low-to-high transition rate (the rising edge rate) of the non-inverted output node 350. The capacitor 334 includes a bottom plate 364 that is coupled to the inverted output node 348 and a top plate 392 that is coupled to a control terminal 366 (e.g., gate terminal) of the transistor 332. An input terminal 374 (e.g., source terminal) of the transistor 332 is coupled to the high voltage rail 344. An output terminal 368 (e.g., drain terminal) of the transistor 332 is coupled to the non-inverted output node 350. The resistor 336 includes a terminal 370 coupled to the control terminal 366 of the transistor 332, and a terminal 372 coupled to the high voltage rail 344. The resistor 336 provides a reset for the boost circuit 324.

Figure 5:
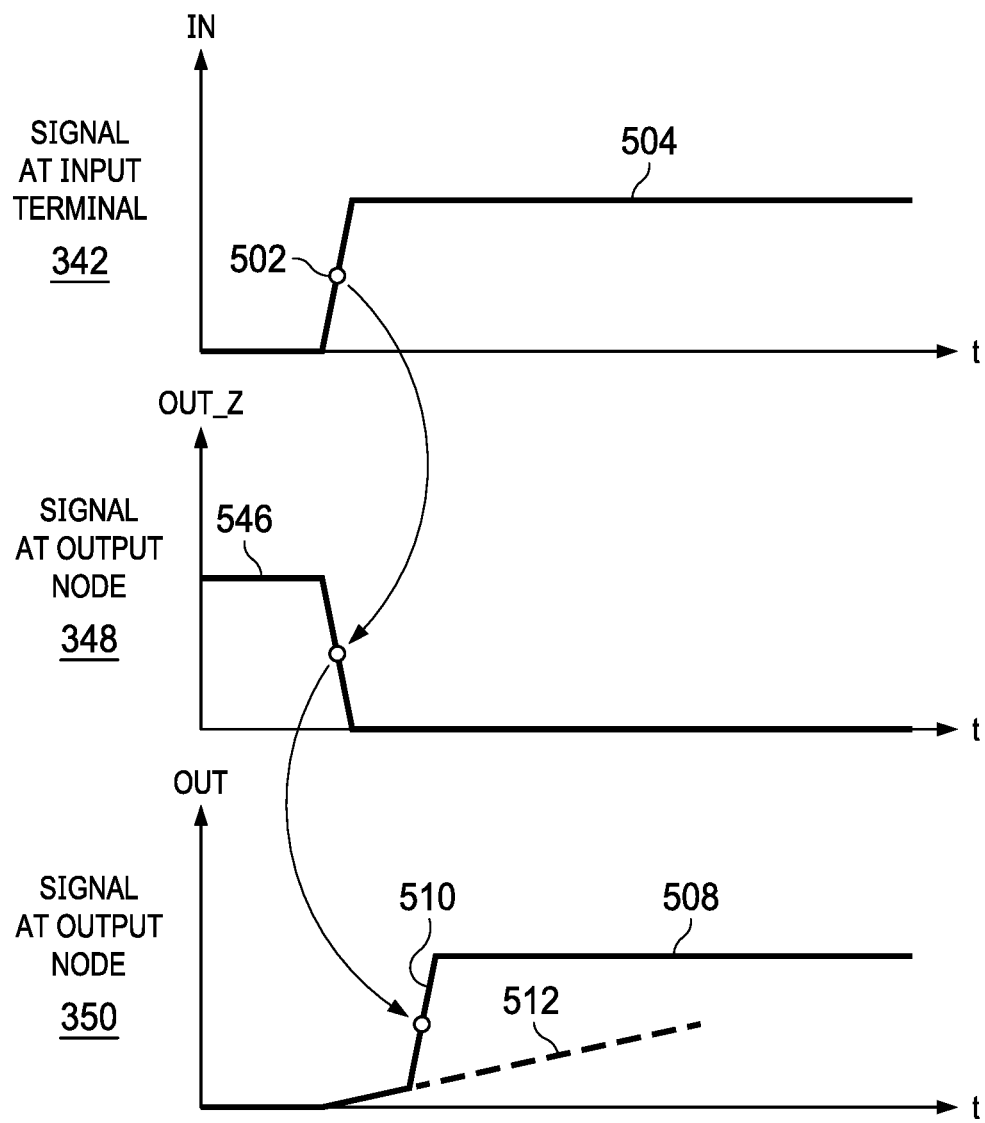

FIG. 5 shows a timing diagram of signals in a level shifter in accordance with the present disclosure. In FIG. 4, as the input signal 504 rises at edge 502, the transistor 308 is activated, and the signal 506 at the inverted output node 348 is quickly pulled down to the high-voltage ground rail 346 via the transistor 314. Pulling the inverted output node 348 to ground momentarily pulls the control terminal 366 of the transistor 332 to the high-voltage ground rail 346 and activates the transistor 332 to quickly pull the non-inverted output node 350 up to the high voltage rail 344 creating a fast rising edge 510 on the signal 508. In implementations of a level shifter that lack the boost circuit 324, the rising edge of the signal 508 may be considerably slower as illustrated by the edge 512.

Thus, the boost circuit 322 and boost circuit 324 increase the rising edge rate of signals on the inverted output node 348 and the non-inverted output node 350, thereby reducing the propagation delay of the level shifter 300. The capacitor 328 and the capacitor 334 may be rated for lower voltages than the capacitors used in level shifters that capacitively couple the input circuit to the output circuit, which simplifies circuit fabrication. Because the level shifter 300 does not include set-reset latches on the inverted output node 348 and the non-inverted output node 350, no synchronization circuit is needed to prevent metastability. Furthermore, because the boost circuit 322 and the boost circuit 324 provide high rising edge drive, the size of the inverter 318, the inverter 320, the transistor 314, and the transistor 316 may be reduced relative to some implementations of a level shifter.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A level shifter, comprising:
    a signal input terminal;
    a first signal output node;
    a first transistor comprising a control terminal coupled to the signal input terminal;
    a second transistor, comprising an output terminal coupled to an input terminal of the first transistor;
    a first capacitor comprising a bottom plate coupled to an input terminal of the second transistor;
    a third transistor comprising:
        a control terminal coupled to a top plate of the first capacitor; and
        an output terminal coupled to the first signal output node; and
    a resistor having:
        a first terminal coupled to the top plate of the first capacitor, and
        a second terminal coupled to a first power supply terminal.

2. The level shifter of claim 1, wherein an input terminal of the third transistor is coupled to the first power supply terminal.

3. The level shifter of claim 1, further comprising:
    a first inverter comprising an input terminal coupled to the signal input terminal;
    a second signal output node;
    a fourth transistor comprising a control terminal coupled to an output terminal of the first inverter;
    a fifth transistor, comprising an output terminal coupled to an input terminal of the fourth transistor;

a second capacitor comprising a bottom plate coupled to an input terminal of the fifth transistor; and a sixth transistor comprising:
  a control terminal coupled to a top plate of the second capacitor; and
  an output terminal coupled to the second signal output node.

4. The level shifter of claim 3, wherein an input terminal of the sixth transistor is coupled to the first power supply terminal.

5. The level shifter of claim 3, further comprising a second resistor, the second resistor comprising:
  a first terminal coupled to the top plate of the second capacitor; and
  a second terminal coupled to the first power supply terminal.

6. The level shifter of claim 3 further comprising:
  a second inverter comprising:
    an input terminal coupled to the first output node; and
    an output terminal coupled to the second signal output node;
  a third inverter comprising:
    an input terminal coupled to the second signal output node; and
    an output terminal coupled to the first output node.

7. The level shifter of claim 3, wherein:
  the input terminal of the second transistor is coupled to the second signal output node; and
  the input terminal of the fifth transistor is coupled to the first output signal node.

8. A level shifter, comprising:
  an input circuit coupled to a low voltage rail and configured to receive an input signal;
  an output circuit coupled to a high voltage rail and configured to generate an output signal at a voltage of the high voltage rail;
  an interface circuit configured to transfer signal from the input circuit to the output circuit;
  wherein the output circuit comprises:
    a first output node;
    a first boost circuit, comprising a first transistor that is capacitively coupled to the interface circuit, the first transistor configured to drive the voltage of the high voltage rail onto the first output node responsive to a first signal received from the interface circuit;
    a second output node, and the interface circuit is configured to drive the first signal onto the second output node; and
    a first inverter, the first inverter configured to drive the first output node responsive to signal present on the second output node.

9. The level shifter of claim 8, wherein the output circuit comprises:
  a second boost circuit, comprising a second transistor that is capacitively coupled to the interface circuit, the second transistor configured to drive the voltage of the high voltage rail onto the second output node responsive to a second signal received from the interface circuit.

10. The level shifter of claim 9, wherein the interface circuit is configured to drive the second signal onto the first output node.

11. The level shifter of claim 9, wherein the output circuit comprises a second inverter, the second inverter configured to drive the second signal output node responsive to signal present on the first signal output node.

12. The level shifter of claim 8, wherein the first boost circuit comprises:
  a capacitor that couples the interface circuit to a gate terminal of the first transistor; and
  a resistor that couples the gate terminal of the first transistor to the high voltage rail.

13. A switch-mode power supply, comprising:
  a power transistor configured to drive an inductor;
  a gate driver coupled to the power transistor, and configured to drive a control terminal of the power transistor; and
  a level shifter coupled to the gate driver, the level shifter comprising:
    a low voltage rail;
    a high voltage rail;
    an input circuit powered via the low voltage rail;
    an interface circuit coupled to the input circuit;
    an output circuit coupled to the interface circuit and powered via the high voltage rail, the output circuit comprising:
      a first boost circuit, comprising a first transistor that is capacitively coupled to the interface circuit, the first transistor configured to switchably connect the high voltage rail to a first output node responsive to a first signal received from the interface circuit;
      a second boost circuit, comprising a second transistor that is capacitively coupled to the interface circuit, the second transistor configured to switchably connect the high voltage rail to a second output node responsive to a second signal received from the interface circuit; and
      a first inverter configured to drive the first output node responsive to signal present on the second output node; and
      a second inverter configured to drive the second output node responsive to signal present on the first output node.

14. The switch-mode power supply of claim 13, wherein the interface circuit is configured to:
  drive the first signal onto the second output node; and
  drive the second signal onto the first output node.

15. The switch-mode power supply of claim 13 wherein the first boost circuit comprises:
  a capacitor that couples the interface circuit to a gate terminal of the first transistor; and
  a resistor that couples the gate terminal of the first transistor to the high voltage rail.

16. The switch-mode power supply of claim 13 wherein the second boost circuit comprises:
  a capacitor that couples the interface circuit to a gate terminal of the second transistor; and
  a resistor that couples the gate terminal of the second transistor to the high voltage rail.

* * * * *